United States Patent [19]
Batchelder et al.

[11] Patent Number: 4,977,330
[45] Date of Patent: Dec. 11, 1990

[54] IN-LINE PHOTORESIST THICKNESS MONITOR

[76] Inventors: Tom W. Batchelder, 524 8th Ave., Menlo Park, Calif. 94025; Kenneth M. Sautter, 385 Sara Ave.; Gary H. Memovich, 450 N. Mathilda Ave., H103, both of Sunnyvale, Calif. 94086

[21] Appl. No.: 311,547

[22] Filed: Feb. 13, 1989

[51] Int. Cl.$^5$ ............................................. G01N 21/86
[52] U.S. Cl. ................................. 250/560; 250/492.2; 356/381
[58] Field of Search ............ 250/226, 560, 561, 492.1, 250/492.2; 356/376, 381

[56] References Cited

U.S. PATENT DOCUMENTS

| | | | |
|---|---|---|---|
| 3,492,491 | 1/1970 | Beeh | 356/381 |
| 4,151,008 | 4/1979 | Kirkpatrick | 250/492.2 |
| 4,450,358 | 5/1984 | Reynolds | 250/492.1 |
| 4,498,009 | 2/1985 | Reynolds | 250/492.1 |
| 4,647,172 | 3/1987 | Batchelder et al. | 354/298 |
| 4,732,473 | 3/1988 | Bille et al. | 250/560 |

OTHER PUBLICATIONS

"Automated Process Monitoring Techniques for Photoresist Handling Systems," Kenneth M. Sautter et al., presented at the Semicom East Technical Symposiums, Sep. 23, 1987.
"Automated Process Monitoring Techniques for Photoresist Handling Systems", Kenneth M. Sautter et al.; Microelectronics Mfg. and Test, Sep. 1987.
"In-Line Automatic Photoresist Process Control", L. Lauchlan, et al., Proceedings of SPI-The International Society for Optical Engineering, vol. 539, Mar. 1985.
"Resist Characterization Using a Multichannel Development Rate Monitor", A. W. McCullough and S. P. Grindle, based on material presented at Sixth International Technical Conference on Photopolymers, Ellenville, N.Y., Nov. 1982.
"Determination of Exposure Dose Via PDR", James A. Bruce et al., Semiconductor International, Jun. 1988.
"Automatic Process Control for VLSI Linewidth", L. Lauchlan, et al., reprinted from Solid State Technology, Apr. 1985.
"Development Rate Monitor (DRM) for Characterization of Photoresist", Perkin-Elmer advertisement.
"In-Process Thickness Monitor for Polycrystalline Silicon Deposition", Research and Development Laboratory, T. I. Kamins and C. J. Dell'Oca, vol. 119, No. 1, Jan. 1972.
"Ellipsometry for Semiconductor Process Control", R. J. Kutko, Solid State Technology, Feb. 1978.

Primary Examiner—David C. Nelms
Assistant Examiner—Stephone B. Allen

[57] ABSTRACT

An in-line photoresist thickness measuring device wherein a plurality of projection optical fibers are disposed over a wafer processing track for illuminating portions of a wafer as the wafer proceeds along the track. The light scattered back from each illuminated portion is detected by a corresponding plurality of pickup optical fibers and communicated to an optical fiber multiplexer. The multiplexer sequentially selects the optical signal from each pickup optical fiber and communicates the light from the selected pickup optical fiber to a spectrometer. The spectrometer simultaneously diffuses the scattered light into a plurality of light bands, each light band having a different wavelength. The plurality of light bands are projected in parallel onto a pin diode array which acts as a photodetector. The electrical signals generated by each pin diode in response to the incident light bands are communicated to a processor which calculates resist thickness for each illuminated portion of the wafer. The average and standard deviation values for the thickness data may be calculated as well.

12 Claims, 4 Drawing Sheets

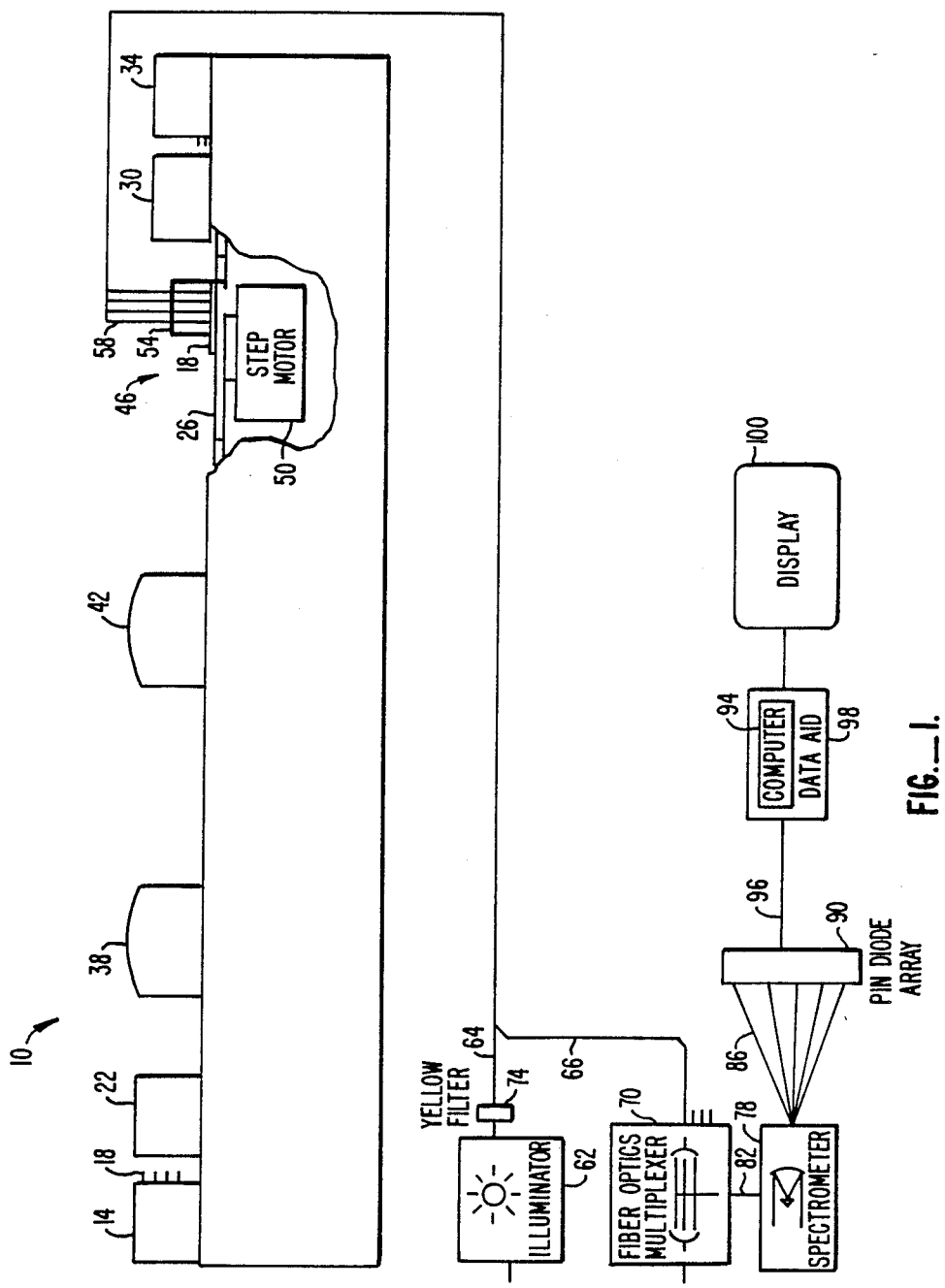
FIG.—I.

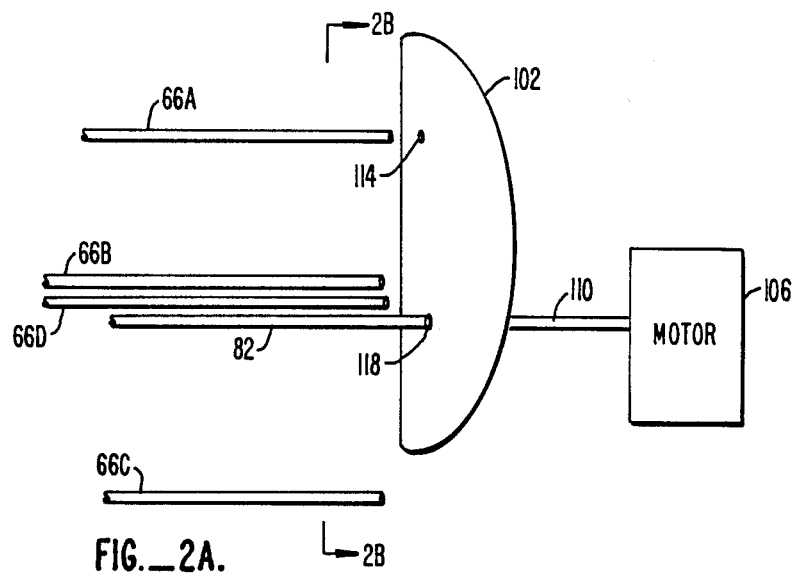
FIG._2A.
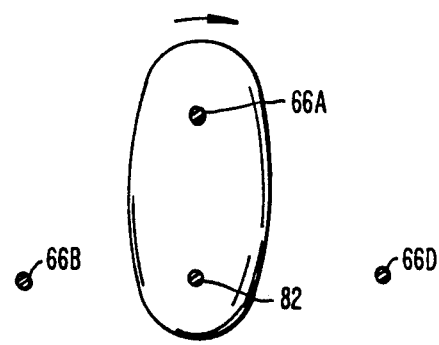
FIG._2B.
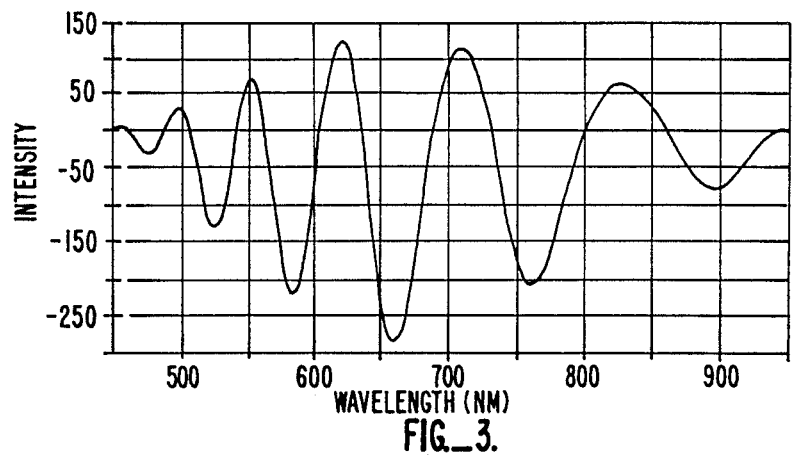
FIG._3.

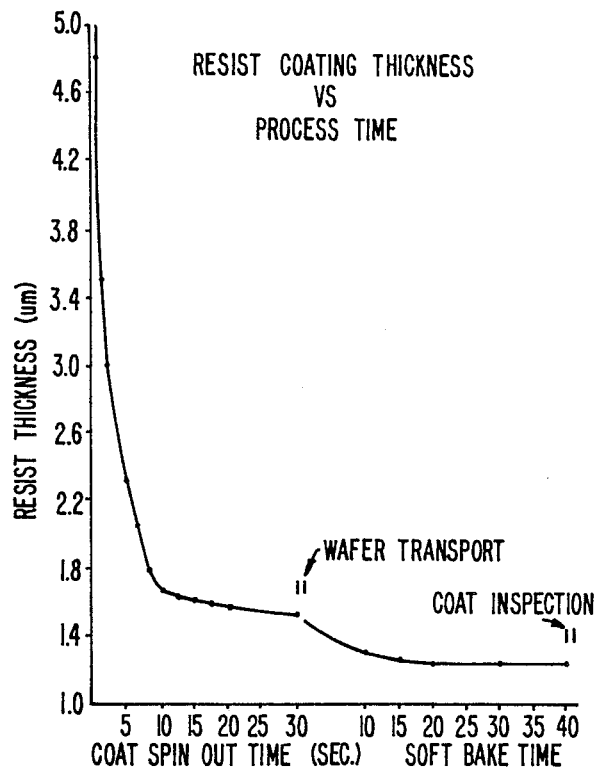
FIG._4.
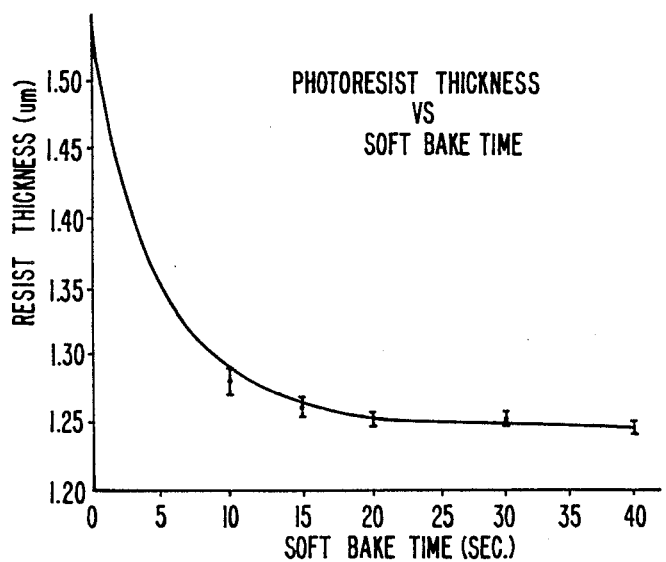
FIG._5.

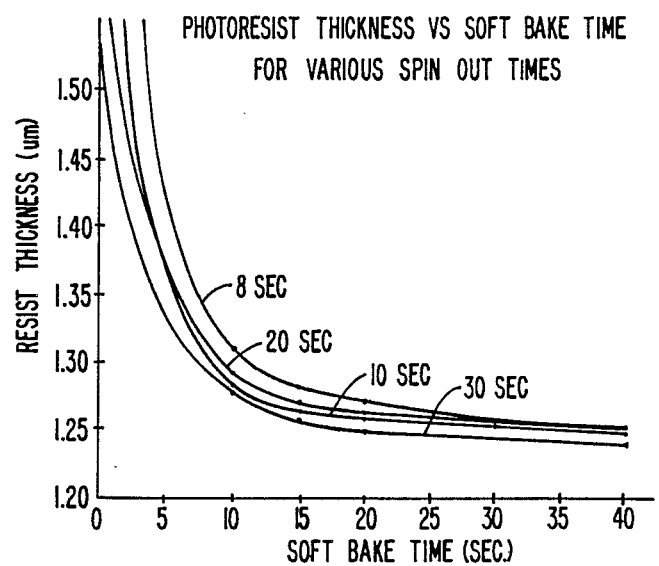
FIG._6.

IN-LINE PHOTORESIST THICKNESS MONITOR

BACKGROUND OF THE INVENTION

A microfiche appendix comprising 2 microfiche and 184 frames accompanies this specification.

FIELD OF THE INVENTION

This invention relates to the application of microlithographic photoresists on the surfaces of semiconductor wafers and, more particularly, to an in-line resist thickness monitor.

DESCRIPTION OF THE RELATED ART

As integrated circuit manufacturers strive for submicron line widths and higher throughput, the ability to monitor the effect of state-of-the-art photolithographic processing techniques on process materials becomes increasingly important. This is especially true when mature, well defined processes are applied to large wafer sizes (i.e., 5–8" in diameter) in order to obtain greater manufacturing efficiencies.

Daily photolithography process set up currently is a tedious, time-consuming chore. The resist pump must be primed, a wafer must be coated with photoresist, and then the coated wafer must be baked. The wafer then must be carried over to a coating thickness measurement station where a random sampling of points are measured around the wafer. Known measuring equipment requires up to one minute of measuring time per point. Thus, when multiple points are measured, an excessive amount of time elapses before the setup process can continue.

Defective coatings may be identified when the average coating thickness measurement is beyond the range of process specifications, or when the standard deviation of thickness measurements around the wafer is larger than a specified tolerance. Once a process parameter is found to be outside of the process specifications, the coating process must be adjusted, another wafer must be coated and baked, and the coating must be manually rechecked until the photoresist thickness is within the process specifications. As a result, a substantial delay often occurs before production processing may begin.

Because of the time required to inspect each wafer and the defects which are often caused by additional wafer handling, there is frequently very little inspection once the process has been set up. Inspection therefore occurs only after the wafers have been imaged and developed. When inspection is reduced to a minimum, the unavoidable and dangerous assumption that coating and baking conditions remain constant is made. As a result, a process defect or variation which arises after process setup may not be noticed until after a non-reversible processing step has occurred, and the expensive defective wafers must be discarded.

SUMMARY OF THE INVENTION

The present invention is directed to an in-line photoresist measuring device which eliminates setup or processing delay while allowing for 100% inspection of the coatings. The device according to the invention measures photoresist thickness in two seconds or less per point. The short measurement time allows photoresist thickness to be measured at processing stations where thickness may be changing rapidly, such as at or near the photoresist application station or the hot plate station. The device can be used to map an entire wafer surface at as many points as desired, and the amount of wafer handling normally required for coating measurement is eliminated.

The foregoing capabilities permit integration of the various process parameters, such as spin-dry time and soft-bake time, in order to reduce overall processing variability and to identify key process parameters. Once it is determined that a parameter is out of specification, defective wafers then may be stripped, cleaned, and recoated. This results in (1) an increase in throughput because time is not wasted exposing and developing bad coatings; (2) an increase in yield because wafers that may otherwise never have been inspected until after a non-reversible processing step had occurred are reworked; and (3) a reduction in set-up time when resist coating equipment is being qualified for production.

In one embodiment of the present invention, a plurality of projection optical fibers are disposed over a wafer processing track for illuminating portions of a wafer as the wafer proceeds along the track. The light scattered back from the illuminated portions is detected by a corresponding plurality of pickup optical fibers and is communicated to an optical fiber multiplexer. The multiplexer sequentially selects the optical signal from each pickup optical fiber and communicates the light from the selected pickup optical fiber to a spectrometer. The spectrometer simultaneously diffuses the scattered light into a plurality of light bands, each light band having a different wavelength. The plurality of light bands are projected in parallel onto a pin diode array which acts as a photodetector. The electrical signals generated by each pin diode in response to the incident light bands are communicated to a processor which calculates resist thickness for the selected portion of the wafer. The average and standard deviation for the thickness data may be calculated as well.

BRIEF DESCRIPTION OF THE DRAWINGS

FIG. 1 is a partial block diagram illustrating an in-line thickness monitor according to the present invention.

FIGS. 2a and 2b are diagrams of the fiber optics multiplexer shown in FIG. 1.

FIG. 3 is a diagram illustrating light intensity as a function of wavelength for light scattered back from a wafer coated with photoresist.

FIG. 4 is a graph showing photoresist coating thickness as a function of process time.

FIG. 5 is a graph showing photoresist thickness as a function of soft bake time.

FIG. 6 is a graph showing photoresist thickness as a function of soft bake time for various spin times.

DETAILED DESCRIPTION OF THE PREFERRED EMBODIMENTS

FIG. 1 is a partial block diagram of a wafer processing station 10 according to the present invention. Wafer processing station 10 includes a cassette 14 which holds a plurality of semiconductor wafers 18. A wafer retriever 22 retrieves individual wafers from cassette 14 and places them on a track 26 for transportation from wafer retriever 22 to a wafer storer 30. Wafer storer 30 in turn, places the processed wafers in a cassette 34. As each wafer travels along the path from cassette 14 to cassette 34, it passes through one or more processing stations. In this embodiment, each wafer 18 passes through a photoresist spin coating station 38 for depositing and spinning a layer of photoresist over the wafer, and a soft-bake station 42 for baking out excess solvent in the resist. An example of the above-described wafer processing unit is a Model 10200 or 10400 photoresist handling track sold by Solitec, Inc. of Santa Clara, Calif.

As each wafer 18 travels along the path from cassette 14 to cassette 34, it passes through a section 46 wherein the motion of the wafer 18 along track 26 is controlled by a stepper motor 50. The purpose of stepper motor 50 is to alternately start and stop wafer 18 as it passes under a bracket 54. Bracket 54 holds a plurality, e.g., 4, bifurcated optical fibers 58. Optical fibers 58 include projection optical fibers 64 coupled to a light source 62, and corresponding pickup optical fibers 66 coupled to a fiber optics multiplexer 70 such as the Merlyn Model 101 available from SC Technology, Inc. of Livermore, Calif. The light from light source 62 preferably passes through a filter 74 for filtering out those wavelengths of light which may expose the resist on the surface of wafer 18.

Light from light source 62 is projected onto the surface of wafer 18 by projection optical fibers 64 for illuminating corresponding portions of the surface of wafer 18. Light scattered back from the surface of wafer 18 is detected by pickup optical fibers 66 and communicated to fiber optics multiplexer 70. Fiber optics multiplexer 70 sequentially communicates the light from each pickup optical fiber 66 to a spectrometer 78 via an optical fiber 82. Spectrometer 78 may comprise a PDA spectrometer Model 400FTM available from SC Technology, Inc. Spectrometer 78 separates the light received over optical fiber 82 into a plurality of light bands 86, each light band having a different wavelength. The plurality of light bands 86 are projected simultaneously in parallel onto a pin diode array 90, such as the PDA detector Model 512Q available from SC Technology, Inc.. The intensity of each light band is converted by pin diode array 90 into a corresponding plurality of electrical signals which are communicated to a computer 94 over a bus 96. Computer 94 includes an analog-to-digital converter 98 for converting the analog signals on bus 96 into digital signals usable by computer 94. Computer 94 may comprise an IBM PC-AT which is programmed in accordance with the instructions shown in the program listed in the microfiche appendix. Computer 94 computes the thickness of each spot illuminated on wafer 18 and displays the results on a display 100. Average and standard deviation values for the plurality of thickness values may be computed as well.

FIGS. 2a and 2b illustrate the construction of fiber optics multiplexer 70. Fiber optics multiplexer 70 comprises an elliptical mirror 102 rotatingly coupled to a motor 106 through a shaft 110. Elliptical mirror 102 has a first focal point 114, termed an "input focal point," and a second focal point 118, termed an "output focal point." It should be noted that shaft 110 aligns with output focal point 118 so that, as elliptical mirror 102 rotates, input focal point 114 defines a circle having output focal point 118 as a center point. Thus, if pickup optical fibers 66a–66d are arranged in a circle as shown in FIG. 3b, the light from each pickup optical fiber 66a–66d will be sequentially communicated from input focal point 114, to output focal point 118, and thereafter to output optical fiber 82.

In operation, wafer processing station 10 interferometrically examines the wafer's surface. Interferometry has long been used by integrated circuit manufacturers for film thickness measurement and end point detection. The technique is based on the fact that the intensity of light reflected from the wafer's surface varies sinusoidally with wavelength as shown in FIG. 3. The variation in intensity is a result of the phase difference between light reflected from the top surface of the resist and light reflected from the resist substrate. The film thickness can be determined from any pair of local maxima or minima by the formula:

$$T = \frac{M}{4n\,(1/\lambda_1 - 1/\lambda_2)}$$

where T is the thin film thickness, M is the number of half wavelengths between the measurement points, n is the refractive index of the film, and $\lambda_1$ and $\lambda_2$ are the wavelengths of the local extrema used.

The use of pin diode array 90 to simultaneously convert each light band 86 into a corresponding voltage allows the recording of the entire visible spectrum in about 0.5 seconds. The fiber optics and associated multiplexer allow measurements to be taken at a plurality of points around the wafer in any pattern desired. The measurement speed allows for the real time monitoring of resist thickness in line on photoresist handling equipment, the track hot plate, or even in the resist spin coating station.

The software used in the device according to the present invention is capable of performing both on-line or off-line measurements of the thickness of films on planar silicon wafers. During both on-line and off-line processing, the software issues commands for positioning the fiber optic multiplexer to select the desired fiber optic cable. The software loads reflectivity data from the spectrometer into the computer's memory, optionally subtracts a background spectrum from the data. The software may display the data and optionally store it in a nonvolatile memory for later use. For on-line processing, the software also coordinates the activities of the wafer handling track by receiving signals from the track when the wafers are in position to be examined, and then by signaling the track when it has finished examining the current wafer at the current position. Three-dimensional profile plots also are available for wafers processed on-line.

Algorithm for Thickness Calculation

In the preferred embodiment, the input data consists of an array of 12-bit integers corresponding to the intensity of the light reflected off the wafer at wavelengths from 450 nanometers to 961 nanometers (in 1 nanometer increments). The data is filtered by performing four subsequent moving averages. Each moving average is of 15 samples at a time, although this value can be changed by the user of the program. After filtering the data, the first derivative of the data can be estimated by calculating the difference between adjacent samples. This calculation is combined with the filtering algorithm so as not to require any extra processing time. By noting every place where the first derivative of the data changes from negative to positive, the program compiles a list of the wavelengths corresponding to all the valleys (local minima) of the data. In this embodiment, an approximation of the thickness is calculated from the wavelengths of two adjacent valleys of the data using the formula:

$$k = \frac{1}{2n\left(\frac{1}{w_1} - \frac{1}{w_2}\right)}$$

where k=the film thickness in nanometers, n=the index of refraction, and $w_1$ and $w_2$ are the wavelengths of two adjacent valleys of the signal.

The spectrum data is converted into the frequency domain by a Fourier transform. The exact value of the Fourier transform of the data at any given frequency is calculated by multiplying the data by sine and cosine functions of that frequency and by summing the results. This provides the imaginary and real part of the Fourier transform, respectively. Because the thickness algorithm uses only the real part of the Fourier transform, the amount of computation required is cut in half. To decrease computation time even further, the Fourier transform may be approximated by multiplying the data by a square wave function instead of a cosine function. This means that most of the needed calculation can be done using integer arithmetic.

Theoretical considerations reveal that the correct thickness will correspond to the largest value of the power spectrum of the Fourier transform. Further consideration leads to the fact that this maximum should occur at a phase of 0°. This means that only the real maximum value.

Starting from the initial guess of the correct thickness, the real part of the Fourier transform is calculated at that point and at a point some distance to the right. The relative intensities at these two points indicates the slope of the curVe in this region. Calculations of points continue at equal intervals in the direction of increasing magnitude of the Fourier transform of the data. When a point is found with a value lower than the maximum value detected so far, then the peak of the Fourier transform has been passed and is now bracketed. The interval of uncertaintY which contains the peak is now narrowed using a golden section search. This algorithm alone would calculate the film thickness to any degree of accuracy desired if not for the unavoidable noise component in the Fourier transform.

Once the search range has been sufficiently narrowed, a least squares quadratic fit of points near the peak is calculated and used to estimate the peak value itself. Because the calculations of a quadratic least squares fit are greatly simplified when the data points used are symmetrical about some center point, this step is preceded by the calculation of enough extra points to satisfy this condition.

As a result of the algorithm and specific software used in the present invention, the thickness calculations are made fast enough to support in-line wafer processing. The speed is achieved by using predominately integer calculations in the algorithms, and the software produces reliable and repeatable measurements. The software is capable of calculating film thickness over a broad range (0.8 to 5.0 microns), and the unprocessed spectrum data from which the thickness is calculated is available to the user for further processing.

FIG. 4 is a graph, created by wafer processing station 10, showing photoresist coating thickness versus process time for a typical coating process. In this test, optical fibers were placed in both the spin coating station 38 and the soft bake station 42. The thickness profile illustrates the rapid thickness change that occurs during the first five seconds of spin out. As the bulk of the resist is spun off the wafer, the thickness is reduced from greater than 5 microns to approximately 1.8 microns. At that point, the coating thickness profile is essentially set. The remaining spin time consists primarily of the drying of the resist film through solVent loss. By using the in-line data collection technique according to the present inVention, a better understanding of the photoresist coating process results. As a result, new procedures for process integration may be devised and quickly evaluated.

In another test, a thickness-versus-time curve for a wafer on a 95° C. bake station was generated and is shown in FIG. 5. The wafer had been coated with a 1.2 micron thick (after bake) positive resist film. The goal was the determination of the time when the photoresist film thickness had stabilized on the 95° C. hot plate. As shown, the curve has virtually zero slope and low data scatter after 30 seconds. Thus, for this resist-temperature combination, a definite upper limit can be set for the process time required, and the limit can be determined without manual processing delays.

In another test, the spin dry time was varied on successive wafers, and the resist thickness was monitored on the hot plate as shown in FIG. 6. The graph indicates that the input resist thickness of the hot plate may vary substantially, but, after 30 seconds of baking, the thickness of the resist was virtually independent of the spin dry time. In fact, most of the solvent had been driven off within 15 seconds, even for the wafers which had a short 5-second spin out. This indicates clearly that spin dry time is not a critical process parameter, even when short bake times (on the order of 45 seconds) are used. Other process variables, such as spin speed, can be monitored with equal ease and intentionally varied at different points during the drying cycle to learn their time-dependent effects.

From the foregoing, it is clear that a wafer processing station according to the present invention provides great speed and flexibility in photoresist thickness measurement. Process parameters may be individually varied and the resulting resist thickness monitored in real time for integrating and optimizing the various coat process steps.

Because of the real time nature of thickness monitoring according to the present invention, high confidence in the thickness data can be maintained, and defects in the process can be corrected before large quantities of marginal coatings are carried out. Since multiple points are being monitored, it is possible to identify a problem (e.g., loss of thickness uniformity across the wafer) which might not otherwise be manifested until line widths are mapped in detail across the wafer, when a drift in the average coating thickness is observed, the controller can compensate for the changing conditions by altering the final spinout speed or other process parameters, and therefore bring the thickness back into the center of the process specification without terminating the process. The device according to the present invention enhances yield in the same manner as robotics wafer handling, with the important difference that no new robotics handling equipment is needed beyond the already existing coating equipment.

While the above is a complete description of a preferred embodiment of the present invention, various modifications may be employed. For example, step motor 50 may be omitted and bracket 58 adapted to follow the wafer as it travels along the process path.

Process stations may be added or deleted, and the fiber optics may be disposed within the station itself. Consequently, the scope of the invention should not be limited except as properly described in the claims.

I claim:

1. In a device for transporting a semiconductor wafer along a path from a first location to a second location and for coating the wafer with a layer of photoresist as it travels along the path, an apparatus for measuring the thickness of the photoresist layer comprising:
    illuminating means, disposed in close proximity to the path for illuminating a portion of the wafer as it travels along the path;
    light receiving means, disposed in close proximity to the path, for receiving the light scattered back from the illuminated portion of the wafer;
    light diffusing means, coupled to the light receiving means, for simultaneously diffusing the scattered light into a plurality of light bands having different wavelengths;
    light detecting means, disposed in close proximity to the diffusing means, for simultaneously detecting each light band and for providing a corresponding plurality of electrical signals in response thereto; and
    calculating means, coupled to the light detecting means, for calculating the thickness of photoresist at the illuminated portion of the wafer from the plurality of electrical signals.

2. The apparatus according to claim 1 wherein the light detecting means comprises a plurality of spaced apart pin diodes, each pin diode detecting one of the light bands.

3. The apparatus according to claim 1 wherein the illuminating means comprises:
    a light source;
    an optical fiber optically coupled to the light source for communicating light emitted therefrom; and
    a bracket disposed in close proximity to the path and coupled to an end of the optical fiber for directing light emitted from the end of the optical fiber onto the wafer.

4. The apparatus according to claim 3 wherein the bracket is stationarily disposed in close proximity to the path and directs the light emitted from the end of the optical fiber toward the path, and further comprising wafer positioning means, disposed in close proximity to the bracket, for momentarily stopping the wafer at a first location in close proximity to the bracket so that the light emitted from the optical fiber illuminates a spot on the wafer.

5. The apparatus according to claim 4 wherein the wafer positioning means moves the wafer from the first location and stops the wafer at a second location in close proximity to the bracket, so that the light emitted from the optical fiber illuminates a different spot on the wafer.

6. The apparatus according to claim 1 wherein the light detecting means comprises a plurality of spaced apart sensors, each sensor detecting one of the light bands.

7. The apparatus according to claim 6 wherein the illuminating means comprises:
    a light source;
    a plurality of projection optical fibers optically coupled to the light source for communicating light emitted therefrom; and
    a bracket disposed in close proximity to the path and coupled to free ends of the plurality of optical fibers for directing light emitted from the free ends of the optical fibers onto the wafer.

8. The apparatus according to claim 7 wherein the light receiving means comprises a plurality of pickup optical fibers, each pickup optical fiber being optically coupled for receiving scattered-back light from an associated projection optical fiber.

9. The apparatus according to claim 8 wherein the light receiving means further comprises light multiplexing means for selectively communicating the light from one of the pickup optical fibers to the light diffusing means.

10. The apparatus according to claim 9 wherein the light multiplexing means further comprises:
    a mirror having first and second focal points;
    an optical fiber optically coupled to the first focal point and to the light diffusing means for communicating light focused at the first focal point to the light diffusing means; and
    positioning means for positioning the mirror so that the second focal point is optically coupled to a selected one of the pickup optical fibers so that the light from the selected pickup optical fiber passes from the first focal point to the second focal point and is communicated to the light diffusing means.

11. The apparatus according to claim 10 wherein the plurality of optical fibers have free ends disposed in close proximity to and facing the mirror the plurality of pickup optical fibers being oriented in a circle, the circle having a radius equal to the distance between the first and second focal points, the first focal point being disposed in the center of the circle and wherein the positioning means comprises rotating means, coupled to the mirror, for rotating the mirror about the first focal point so that the second focal point progressively aligns with the free end of each pickup optical fiber for receiving light emitted therefrom.

12. The apparatus according to claim 11 wherein the mirror is an elliptical mirror.

* * * * *

UNITED STATES PATENT AND TRADEMARK OFFICE
CERTIFICATE OF CORRECTION

PATENT NO. : 4,977,330

DATED : December 11, 1990

INVENTOR(S) : Tom W. Batchelder, et al.

It is certified that error appears in the above-identified patent and that said Letters Patent is hereby corrected as shown below:

On the title page:

Please add to the list of inventors --Richard N. Savage, 1406 Spring Valley Common, Livermore, California 94550--.

Please add the following assignment information: --Solitec, Inc., Santa Clara, California and SC Technology, Inc., Livermore, California--.

Signed and Sealed this

Twelfth Day of May, 1992

Attest:

DOUGLAS B. COMER

Attesting Officer

Acting Commissioner of Patents and Trademarks